United States Patent
Tang et al.

(10) Patent No.: US 8,181,147 B2
(45) Date of Patent: May 15, 2012

(54) PARAMETRIC DATA-BASED PROCESS MONITORING FOR ADAPTIVE BODY BIAS CONTROL

(75) Inventors: Robin Tang, San Jose, CA (US);
Ephrem Wu, San Mateo, CA (US);
Tezaswi Raja, San Jose, CA (US)

(73) Assignee: LSI Corporation, Milpitas, CA (US)

(*) Notice: Subject to any disclaimer, the term of this patent is extended or adjusted under 35 U.S.C. 154(b) by 389 days.

(21) Appl. No.: 12/493,658

(22) Filed: Jun. 29, 2009

(65) Prior Publication Data
US 2010/0333057 A1    Dec. 30, 2010

(51) Int. Cl.
*G06F 17/50* (2006.01)
(52) U.S. Cl. ........................................................ 716/136
(58) Field of Classification Search .......... 716/126–127, 716/132–133, 136
See application file for complete search history.

(56) References Cited

U.S. PATENT DOCUMENTS

| | | | |
|---|---|---|---|
| 6,694,492 B1 * | 2/2004 | Shakkarwar | 716/133 |
| 6,908,227 B2 * | 6/2005 | Rusu et al. | 374/141 |
| 6,948,082 B2 * | 9/2005 | Gschwind et al. | 713/320 |
| 7,051,295 B2 * | 5/2006 | Narendra et al. | 716/111 |
| 7,174,528 B1 * | 2/2007 | Burr et al. | 716/127 |
| 7,334,198 B2 * | 2/2008 | Ditzel et al. | 716/133 |
| 7,525,373 B1 * | 4/2009 | Ogilvie et al. | 327/564 |
| 7,557,626 B1 * | 7/2009 | Zortea | 327/158 |
| 7,576,569 B2 * | 8/2009 | Carpenter et al. | 327/14 |
| 2009/0289696 A1 * | 11/2009 | Lewis et al. | 327/534 |
| 2010/0037188 A1 * | 2/2010 | Jamann et al. | 716/2 |
| 2010/0083193 A1 * | 4/2010 | Mbouombouo et al. | 716/1 |
| 2010/0253387 A1 * | 10/2010 | Wang et al. | 326/34 |

* cited by examiner

*Primary Examiner* — Stacy Whitmore

(57) ABSTRACT

Various embodiments of systems and methods are disclosed for providing adaptive body bias control. One embodiment comprises a method for adaptive body bias control. One such method comprises: modeling parametric data associated with a chip design; modeling critical path data associated with the chip design; providing a chip according to the chip design; storing the parametric data and the critical path data in a memory on the chip; reading data from a parametric sensor on the chip; based on the data from the parametric sensor and the stored critical path and parametric data, determining an optimized bulk node voltage for reducing power consumption of the chip without causing a timing failure; and adjusting the bulk node voltage according to the optimized bulk node voltage.

21 Claims, 4 Drawing Sheets

PARAMETRIC DATA-BASED PROCESS MONITORING FOR ADAPTIVE BODY BIAS CONTROL

FIELD OF THE INVENTION

The invention generally relates to integrated circuits and, more particularly, to adaptive body bias schemes for adjusting bulk node voltage in integrated circuits.

BACKGROUND

Power consumption is a significant design and operational issue in many types of integrated circuits. For example, in deep-submicron technologies, high leakage power consumption is a major concern. A common technique for reducing power consumption in certain types of chips is body biasing. Body biasing solutions reduce the leakage power of a system by altering the bulk node potential ($V_{bulk}$) at the expense of operating frequency. The bulk node potential refers to the voltage at the bulk terminal of a semiconductor device. Certain types of metal-oxide semiconductors, such as field-effect transistors (FETs), comprise four terminals—a gate terminal, a drain terminal, a source terminal, and a bulk terminal. The gate terminal controls the opening and closing of a physical gate. The gate permits electrons to flow through or blocks their passage by creating or eliminating a channel between the source terminal and the drain terminal. Electrons flow from the source terminal towards the drain terminal if influenced by an applied voltage. The bulk terminal or node refers to the bulk of the semiconductor in which the gate, source and drain reside. The bulk terminal serves the purpose of biasing the transistor into operation.

Body biasing is a technique by which bulk terminals of the semiconductor devices are connected together, and the voltage at this "bulk node" is altered to reduce the leakage power of the chip. The bulk node voltage may be altered to produce back biasing or forward biasing. For example, when body biasing an n-type FET, back biasing refers to reducing the bulk node voltage below the source voltage ($V_{SS}$). Back biasing may be used to reduce leakage power at the cost of decreased speed and performance of the transistors. Forward biasing refers to increasing the bulk node voltage above the source voltage. Forward biasing improves the speed and performance of the transistors at the cost of increased power leakage.

Currently, there are various adaptive body biasing (ABB) control schemes that are used to automatically adjust the bulk node voltage to minimize leakage power of a die without causing a functional failure. ABB control systems implement an autonomous closed-loop solution comprising process monitors, control circuitry, and voltage regulators. The process monitors estimate die conditions (e.g., process, voltage, and temperature (PVT) conditions). The control circuitry, which is added to the chip, determines whether to raise, lower, or maintain the bulk node voltage based on the PVT conditions. The voltage regulators serve the function of changing the bulk node voltage based on the control circuitry.

In one common ABB control scheme, the control circuitry comprises critical path replica (CPR) circuits that are added to the chip to replicate certain paths of electronic circuitry that are critical to the performance of the chip. A critical path may represent a particular circuit on the chip that is slower, due to any variety of reasons, such as circuit complexity. A circuit path that limits or otherwise affects the overall performance frequency of other circuit paths and/or or the chip itself may be considered a critical path. In this ABB control scheme, a copy of each critical path in the design is added to the chip. Each CPR includes a timing delay that provides the timing margin for the scheme. The body bias voltage is altered slowly in the design, and this increases the delay of the critical paths. Once the critical path delay approaches a timing failure (or maximum frequency), the paths in the monitor fail first due to the added timing margin. When a failure is detected in the critical path, the body bias is not scaled and is maintained at the current level. This technique ensures that the body bias is set at an optimal level without causing a timing failure.

In addition to CPR circuits, some ABB control schemes add extra logic (referred to as critical path detectors (CPD)) to each critical path in the design. In each CPR logic, a further timing delay is added for providing the timing margin. In this scheme, the body bias voltage is altered slowly and this increases the delay of the critical paths. When the critical path delay approaches a timing failure (or maximum frequency), the paths in the CPD fail first due to the added timing margin. Once a failure is detected in the CPD logic, the body bias is not scaled and is maintained at the current level. This technique also ensures that the body bias is set at an optimal level without causing a timing failure.

Existing ABB control schemes, however, have significant disadvantages. They require adding extra logic into critical paths of the chip, which increases the cost, complexity, and the development time of the design. They also rely on exciting each critical path during normal operation in order to control the bulk node voltage. Furthermore, the chip overhead is increased in proportion to the number of critical paths being monitored.

Despite the many advantages of existing ABB control schemes, there remains a need in the art for improved schemes that address one or more of these disadvantages.

SUMMARY

Various embodiments of systems and methods are disclosed for providing adaptive body bias control. One embodiment is a system for providing adaptive body bias control. One such system comprises: a chip comprising at least one critical path and a module comprising one or more transistors, a parametric process monitor for sensing information associated with the one or more transistors, and a voltage regulator for regulating a bulk node voltage associated with the one or more transistors; a memory device storing critical path data associated with the at least one critical path on the chip and parametric data associated with the chip; and a microcontroller in communication with the chip and the memory device, the microcontroller comprising an adaptive body biasing control module configured to: receive monitored data from the parametric process monitor; receive from the voltage regulator a proposed adjustment to a bulk node voltage corresponding to the module; based on the proposed adjustment and the parametric data stored in the memory device, determine an estimated gate delay; estimate a critical path delay, based on the gate delay; and, if the estimated critical path delay does not exceed a maximum delay corresponding to the critical path data, instruct the voltage regulator to adjust a bulk node voltage.

Another embodiment comprises a method for adaptive body bias control. One such method comprises: modeling parametric data associated with a chip design; modeling critical path data associated with the chip design; providing a chip according to the chip design; storing the parametric data and the critical path data in a memory on the chip; reading data from a parametric sensor on the chip; based on the data from the parametric sensor and the stored critical path and parametric data, determining an optimized bulk node voltage for reducing power consumption of the chip without causing a timing failure; and adjusting the bulk node voltage according to the optimized bulk node voltage.

A further embodiment comprises a computer program embodied in a computer-readable medium and executable by a processor. One such computer program comprises logic configured to: receive monitored data associated with transistors on a chip from a parametric process monitor; receive a proposed voltage adjustment to a bulk node voltage corresponding to the chip; based on the proposed adjustment and parametric data stored in a memory device, determine an estimated gate delay; estimate a critical path delay, based on the gate delay; and if the estimated critical path delay does not exceed a maximum delay corresponding to critical path data stored in the memory device, instruct a voltage regulator to adjust a bulk node voltage.

DETAILED DESCRIPTION

Various embodiments of adaptive body bias (ABB) control schemes are disclosed which use parametric data-based process monitoring systems and methods. In this regard, the disclosed ABB control schemes are generally referred to as parametric data-based process monitoring adaptive body bias (PDPM/ABB) control schemes. In general, the PDPM/ABB control schemes are used to adjust the bulk node voltage of a chip or integrated circuit (or one or more modules on the chip or integrated circuit) to minimize the leakage power of a die without causing a functional failure. As described in more detail below with reference to FIGS. 1-5, the bulk node voltage is automatically adjusted based on a unique control algorithm that monitors, during operation of the chip, parametric data associated with the chip or module(s) on the chip and compares the operational parametric data with information stored in memory. The operational parametric data may comprise, for example, a saturation on current ($I_{on}$) and/or a saturation off current ($I_{off}$) associated with transistor(s) on the chip. The stored information (which may reside on the chip or otherwise be accessible by the control algorithm) may comprise, for example, predetermined critical path data and/or parametric data. The critical path data generally comprises simulation data, model data, or empirical data associated with one or more identified critical paths of the chip. The stored parametric data comprises information that characterizes the particular technology of the chip design (e.g., transistor types, gate types, wires, etc.) at predetermined voltage and/or temperature conditions. Based on a comparison of the operational parametric data to the stored critical path and/or parametric data, the control algorithm determines and initiates an adjustment to the bulk node voltage.

It should be appreciated with reference to this disclosure that the PDPM/ABB control scheme may be implemented in any chip with ABB and/or modified to support adaptive voltage scaling (AVSO) capability. It should be further appreciated that the PDMP/ABB control schemes may provide various advantages over existing schemes. For example, the PDPM/ABB scheme may be implemented as a generic control architecture that may be applied to any chip design. Area overhead may be significantly reduced because the extra logic associated with the critical path replica circuits and/or the critical path detectors is not needed. Furthermore, the control scheme enables the stored critical path and/or parametric information to be updated after the design is completed.

Figure 1:
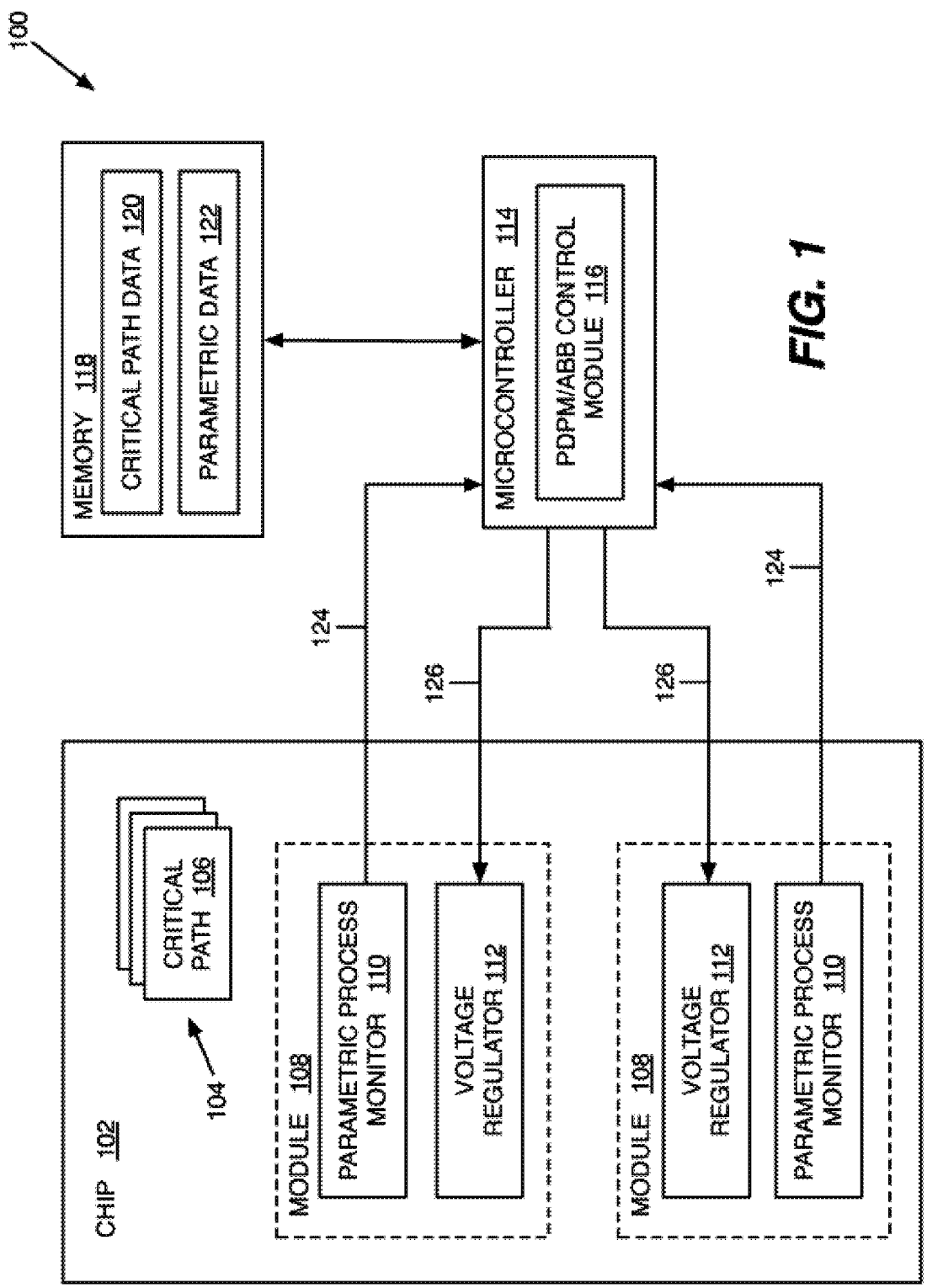
FIG. 1 is a block diagram illustrating an embodiment of a parametric data-based process monitoring adaptive body bias (PDPM/ABB) control system.

FIG. 1 illustrates an embodiment of a PDPM/ABB control system 100. The PDPM/ABB control system 100 generally comprises an integrated circuit (e.g., a chip 102), a memory 118, and a microcontroller 114. The memory 118 and the microcontroller 114 may be located on the chip 102 or otherwise in communication with the chip 102. In an embodiment, the memory 118 comprises on-chip memory, such as, random access memory (RAM). The chip 102 includes circuitry 104 having one or more critical paths 106. As known in the art, a critical path 106 refers to an arrangement of electronic circuitry (e.g., a plurality of interconnected transistors) on the chip 102 that limits or otherwise affects the overall performance frequency of the chip 102 and/or other circuit path(s) on the chip 102.

The chip 102 may also include one or more functional modules 108. A module 108 represents a portion of the circuitry of the chip 102 that performs a particular function. In this regard, the chip 102 may but need not include multiple modules 108 for performing various functions. Each module 108 includes a parametric process monitor 110 and a voltage regulator 112. In general, the parametric process monitor 110 senses or otherwise determines operational parametric data associated with the corresponding module 108 and provides the data to the microcontroller 114 via a connection or interface 124. In an embodiment, the parametric process monitor 110 may comprise an on-die sensor (e.g., a ring oscillator, a thermometer, etc.). It should be appreciated that the parametric data provided to the microcontroller 114 may include the $I_{on}$ and/or $I_{off}$ associated with the module 108.

In general, the parametric process monitor 110 may monitor, for example, the temperature, supply voltage variation as well as the process corner of the chip 102. To enhance data accuracy, the parametric process monitor 110 may be located near the critical paths 106 and receive the same power supply as the critical path circuitry. It may comprise circuitry, such as, one or more ring oscillators and/or thermometers. The ring oscillator(s) may output cell delays and/or frequencies to the microcontroller 114. This and other information may be associated with $I_{on}$ and/or $I_{off}$ of the cell. For example, a ring may comprise an inverter with suitable fan-out so its cell (or gate) delay or the frequency of the ring oscillator may be associated with the inverter, which may be used in the critical path circuitry. The threshold voltage of the inverter may be changed, as desirable for the particular implementation. In some embodiments, the inverter may also be replaced with, for example, 2-input NAND gates. In this manner, the cells in the critical path circuitry may have the corresponding ring oscillator in the parametric process monitor 110 and the cell delay may be monitored, although the supply voltage and temperature varies from time to time.

The voltage regulator 112 is in communication with the microcontroller 114 via a connection or interface 126. The voltage regulator 112 receives voltage adjustments from the microcontroller 114 based on a PDPM/ABB control module 116, and adjusts a bulk node voltage of the chip 102. In an embodiment, the voltage regulator 112 may comprise, for example, a charge pump that uses the charge redistribution principle to charge the voltage below the ground voltage or beyond the supply voltage. A control signal received from the interface 126 may comprise an enable signal to activate the charge pump so the back-bias voltage can be pumped to the right voltage. The output from the parametric process monitor 110 may follow the change of the back-bias voltage and be sent to the microcontroller 114 for re-evaluation. When the right back-bias voltage is reached, the enable signal may be de-asserted and the charge pumps stops pumping. The back-bias voltage may stay at this level.

Figures 2, 3:
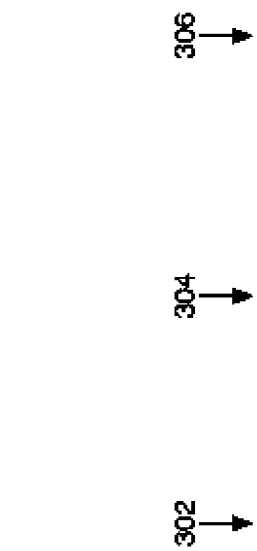
FIG. 2 is a data diagram illustrating an embodiment of a critical path table.
FIG. 3 is a data diagram illustrating an embodiment of a parametric table table.

The memory 118 stores critical path data 120 and parametric data 122. As mentioned above, the critical path data 120 may comprise simulation data, model data, or empirical data associated with one or more identified critical paths of the chip. In an embodiment, as illustrated in FIG. 2, the critical path data 120 may comprise a critical path table 200 that stores data for each critical path 106. The critical path table 200 may store delay information for each critical path 106 under different temperature and supply voltages. Each critical path 106 may be associated with one or more cells. One of ordinary skill in the art will appreciate that the cells can be any of the standard cells or other cells typically used in a chip design library. The number of cells used in the critical path table 200 may be based on the desired accuracy and/or resolution. For instance, more cells may enable more accurate timing data to be constructed from the critical path table 200. As illustrated in the embodiment of FIG. 2, the critical path table 200 may comprise various data fields, such as, a critical path identifier (CP_ID) field 202, a temperature/voltage field 204, a wire delay field 206, cell delay fields for each cell in the critical path 106 (e.g., fields 208a-c), and one or more simulation constants (e.g., constant K field 210 and constant R field 212, representing empirical numbers obtained from a simulation).

It should be appreciated that the critical path delay may not only be associated with the type of cells but also related with, for example, the output loading, the input slew rate, noise, etc. To reduce the complexity of the calculation, the critical path table 200 may include constants obtained from the simulation. For example, in the embodiment illustrated in FIG. 2, the constants K and R may be introduced, such that Equation 1 below may be satisfied.

$$K*\text{Sum}(\text{delay from cell } i * \text{number of cell } i) + \text{wire delay} + R < \text{clock cycle time};\quad \text{Equation 1}$$

where i is from 1 to the number of cells defined in the critical path table.

Equation 1

The parametric data 122 comprises information related to the underlying technology of the chip 102 (e.g., transistor types, gate types, wires, etc.) at predetermined voltage and/or temperature conditions. In an embodiment, as illustrated in FIG. 3, the parametric data 122 may comprise a parametric data table 300 that stores cell delay information under, for example, different supply voltages, temperature, and back-bias voltage. As illustrated in the embodiment of FIG. 3, the parametric data table 300 may comprise various data fields, such as, a voltage drain draing ($V_{dd}$) field 302, a temperature field 304, a back-bias voltage ($V_{bias}$) field 306, and ring oscillator cell delay fields 308. It should be appreciated that the cells used in the parametric data table 300 may be associated with the the ring oscillators in the parametric process monitor(s) 110. The microcontroller 114 compares the delay from the parametric data table 300 with the delay from the outputs of the parametric process monitor 110. The ratio of the delays may be determined and used to adjust the constant K value in the critical path table 200 such that the critical path delay equation (Equation 1 above) may be satisfied with the new K value.

For example, assume the chip 102 is in the low temperature and high supply voltage condition, the delay measured from the parametric process monitor 110 may be shorter than the ones defined in the parametric data table 300. The new K value in the critical path delay equation may be adjusted. The critical path 106 of the chip 102 may still meet the timing requirement but the chip 102 may experience higher leakage current and power consumption. To remedy this issue, the microcontroller 114 may lower back-bias voltage (more negative) to increase the transistor's threshold voltage and thus in effect slow down the transistors. Therefore, the leakage current may be reduced and the critical path timing still met. Similarly, if the chip 102 is in the high temperature and low supply voltage condition, the new K value may be increased and the critical path timing may violate the timing requirement. To avoid the timing violation, the microcontroller 114 may increase back-bias voltage (less negative) to decrease the transistor's threshold voltage and thus in effect speed up the transistors. Therefore, the critical path timing requirement may be satisfied.

The microcontroller 114 includes a PDPM/ABB control module 116, which may comprise any combination of hardware, firmware, and/or software. The PDPM/ABB control module 116 comprises the logic and/or functionality for implementing the PDPM/ABB control scheme. As mentioned above briefly and described in more detail below, the PDPM/ABB control module 116 determines and initiates adjustments to the bulk node voltage of the module(s) 108 based on a comparison of the operational parametric data to the critical path data 120 and the parametric data 122 stored in memory 118.

Figure 4:
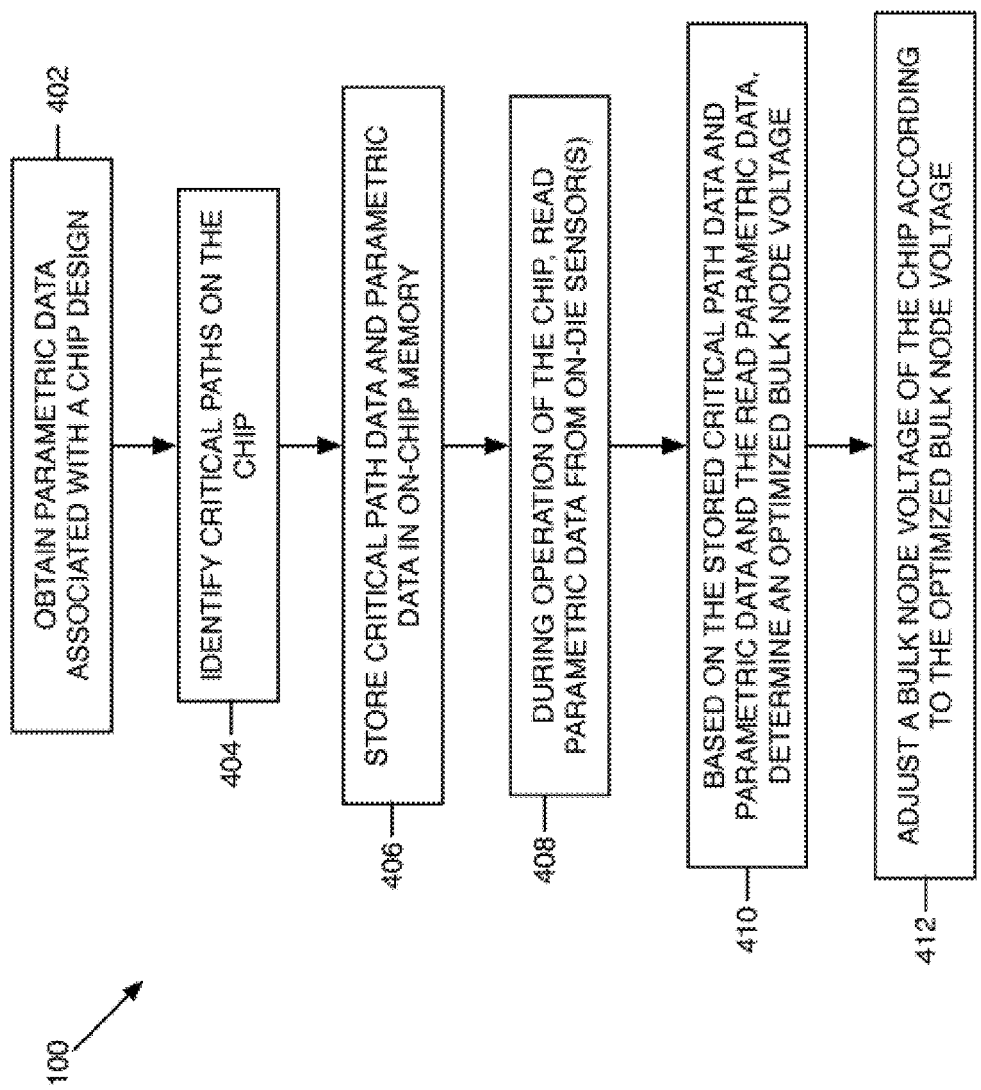
FIG. 4 is a flowchart illustrating an embodiment of a method for providing adaptive body bias control of an integrated circuit.

FIG. 4 illustrates an embodiment of a method for providing adaptive body bias control. The method may be implemented in PDMP/ABB control system 100 or other systems configured to perform adaptive body biasing and/or adaptive voltage scaling (AVSO). At block 402, parametric data 122 associated with design of chip 102 is obtained. In an embodiment, the parametric data 122 may be obtained by simulating gate delays of transistors associated with the chip 102. For example, the gate delays may be simulated at different voltage and temperature conditions and different saturation currents (i.e., $I_{on}$, $I_{off}$). Further simulation data may be implemented, as desired, such as, the relationship between $I_{on}$ versus $V_{bulk}$ at different voltage and temperature conditions. The simulation data may be combined into a parametric data table (FIG. 2) that stores a record for each gate type and data related to the change in gate delay relative to $V_{bulk}$ at a given $I_{on}$, voltage and temperature.

At block 404, critical paths in the chip 102 may be identified and critical path data 120 generated. The critical path data 120 may be obtained by simulating critical path replicas at given voltage and temperature conditions. In an embodiment, the simulation data may include the data illustrated in FIG. 3. The critical path data 120 may be obtained from other sources, such as, Static Timing Analysis (STA) reports. At block 306, the critical path data 120 and the parametric data 122 are stored in memory 118. At block 408, during operation of the chip 102, the microcontroller 114 reads parametric data from the parametric process monitors 110. At block 410, the microcontroller 114 determines an optimized bulk node voltage based on the read parametric data, the critical path data 120, and the parametric data 122. At block 412, the bulk node voltage of the chip 102 is adjusted according to the optimal bulk node voltage calculated by the microcontroller 114.

Figure 5:
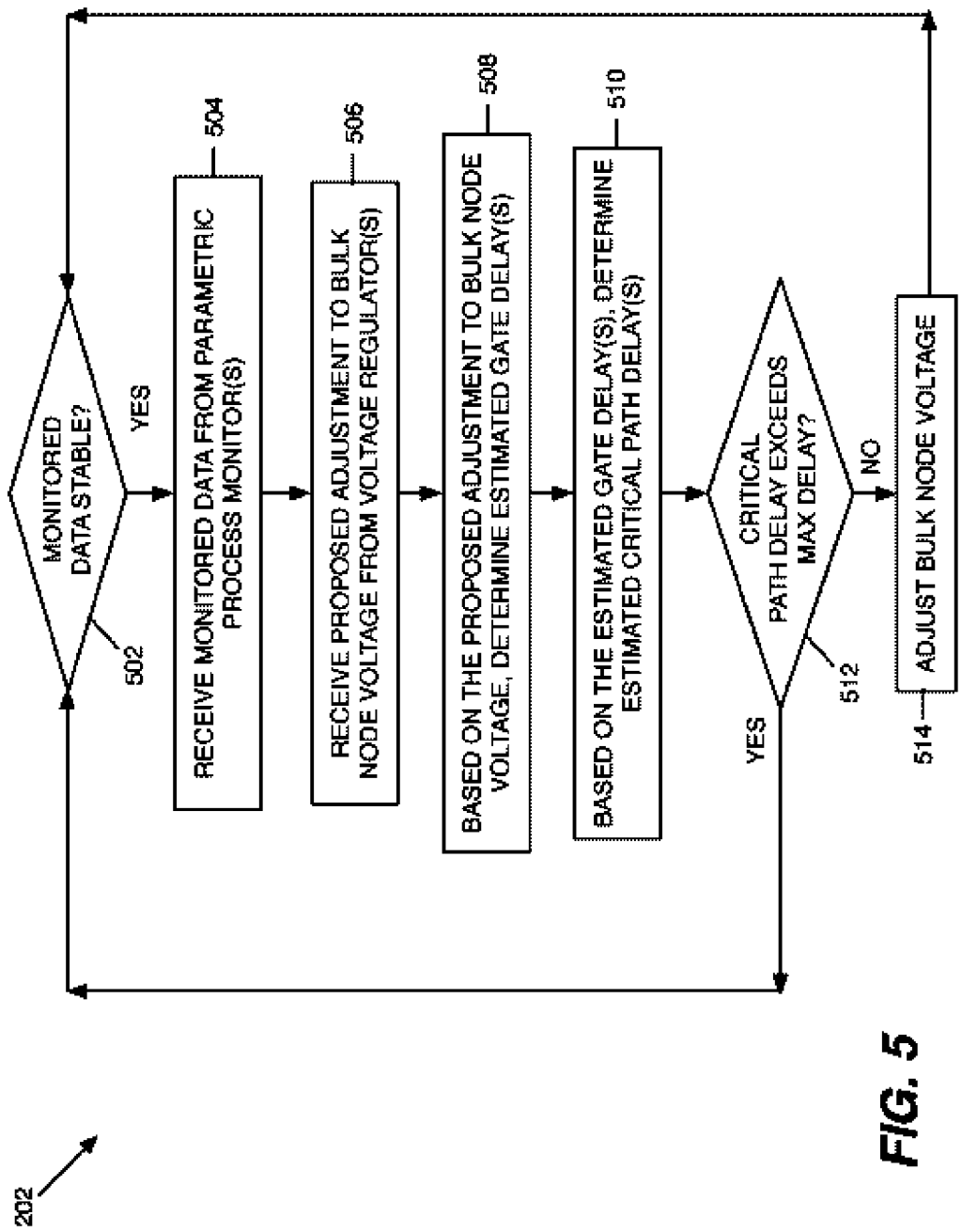
FIG. 5 is a flowchart illustrating the architecture, operation, and/or functionality of an embodiment of the PDPM/ABB control module in the microcontroller of FIG. 1.

FIG. 5 illustrates the architecture, operation, and/or functionality of an embodiment of the PDPM/ABB control module 116 in FIG. 1. At decision block 502, the PDPM/ABB control module 116 receives monitored data from the parametric process monitors 110 and determines whether the monitored data (e.g., a saturation current of the chip 102, delay time, etc.) is stable. The monitored data may not be stable due to the change of back-bias voltage, which is controlled by the voltage regulator 112. For example, there may be a delay for the charge pump of the voltage regulator 112 to pump bias-bias voltage to the desired level. The parametric process monitor 110 may be activated periodically to save power. A voting system may be used such that, if the monitored data is the same for a predetermined number of cycles, the monitored data is stable. If stable, at block 504, the PDPM/ABB control module 116 receives monitored data from the parametric process monitor(s) 110. At block 506, the PDPM/ABB control module 116 receives a proposed adjustment to the bulk node voltage from a voltage regulator 112. The microcontroller 114 may determine the adjustment and the voltage regulator 112 executes the adjustment. As described above, the microcontroller 114 may provide an activation signal to the voltage regulator 112, which activates charge pump circuitry in the voltage regulator 112 to adjust the back-bias voltage. When the activation signal is de-activated, the voltage regulator 112 stops charge pumping.

At block 508, the PDPM/ABB control module 116 determines an estimated gate delay based on the proposed adjustment to $V_{bulk}$. At block 510, critical path delay(s) are estimated based on the estimated gate delay. At decision block 512, the PDPM/ABB control module 116 determines whether the critical path delay exceeds a maximum delay. If the critical path delay exceeds the maximum delay, the $V_{bulk}$ is not adjusted and the process returns to decision block 502. If, however, the critical path delay does not exceed the maximum delay, at block 514, the PDPM/ABB control module 116 calculates the optimal adjustment for $V_{bulk}$ and initiates the adjustment via the voltage regulator 110.

It should be appreciated that one or more of the process or method descriptions associated with the flow charts illustrated in FIGS. 4 and 5 may represent modules, segments, logic or portions of code that include one or more executable instructions for implementing logical functions or steps in the process. It should be further appreciated that the logical functions may be implemented in software, hardware, firmware, or any combination thereof. In certain embodiments, the logical functions may be implemented in software or firmware that is stored in memory or non-volatile memory and that is executed by hardware (e.g., microcontroller 114) or any other processor(s) or suitable instruction execution system associated with the PDPM/ABB control system 100. Furthermore, the logical functions may be embodied in any computer readable medium for use by or in connection with an instruction execution system, apparatus, or device, such as a computer-based system, processor-containing system, or other system associated with the PDPM/ABB control system 100 that can fetch the instructions from the instruction execution system, apparatus, or device and execute the instructions.

It should be noted that this disclosure has been presented with reference to one or more exemplary or described embodiments for the purpose of demonstrating the principles and concepts of the invention. The invention is not limited to these embodiments. As will be understood by persons skilled in the art, in view of the description provided herein, many variations may be made to the embodiments described herein and all such variations are within the scope of the invention.

What is claimed is:

1. A system for providing adaptive body bias control, the system comprising:
   a chip comprising at least one critical path and a module comprising one or more transistors, a parametric process monitor for sensing information associated with the transistors, and a voltage regulator for regulating a bulk node voltage associated with the transistors;
   a memory device storing critical path data associated with the at least one critical path on the chip and parametric data associated with the chip; and
   a microcontroller in communication with the chip and the memory device, the microcontroller comprising an adaptive body biasing control module configured to:
      receive monitored data associated with the transistors from the parametric process monitor;
      receive from the voltage regulator a proposed adjustment to a bulk node voltage corresponding to the module;
      based on the proposed adjustment and the parametric data stored in the memory device, determine an estimated gate delay;
      estimate a critical path delay, based on the gate delay; and
      if the estimated critical path delay does not exceed a maximum delay corresponding to the critical path data, instruct the voltage regulator to adjust a bulk node voltage.

2. The system of claim 1, wherein the memory device comprises on-chip memory.

3. The system of claim 1, wherein the microcontroller and the memory device are located on the chip.

4. The system of claim 1, wherein the parametric data comprises simulation data of a gate delay of each gate type in the chip design at a plurality of voltage and temperature conditions and saturation currents.

5. The system of claim 1, wherein the critical path data comprises a simulation of a critical path replica in the chip according to predetermined voltage and temperature conditions.

6. The system of claim 1, wherein the critical path data comprises data from a static timing analysis of the chip.

7. The system of claim 1, wherein the memory device is configured to update the critical path data and the parametric data.

8. A method for adaptive body bias control, the method comprising:
   modeling parametric data associated with a chip design;
   modeling critical path data associated with the chip design;
   providing a chip according to the chip design;
   storing the parametric data and the critical path data in a memory on the chip;
   reading data from a parametric sensor on the chip;
   based on the data from the parametric sensor and the stored critical path and parametric data, determining an optimized bulk node voltage for reducing power consumption of the chip without causing a timing failure; and
   adjusting the bulk node voltage according to the optimized bulk node voltage, wherein the modeling the parametric data comprises simulating a gate delay of each gate type in the chip design at a plurality of voltage and temperature conditions and saturation currents.

9. The method of claim 8, wherein the modeling the critical path data comprises simulating a critical path replica according to predetermined voltage and temperature conditions.

10. The method of claim 8, wherein the parametric sensor comprises an on-die sensor.

11. The method of claim 10, wherein the on-die sensor comprises at least one of a ring oscillator and a thermometer.

12. The method of claim 8, wherein the reading data from a parametric sensor on the chip comprises receiving saturation current information.

13. The method of claim 12, wherein the saturation current information comprises the saturated on current of a transistor on the chip.

14. The method of claim 8, wherein the determining the optimized bulk node voltage comprises estimating a delay associated with a critical path in the chip as function of one or more of a saturation current, a stack height, voltage, temperature, and wire delay.

15. The method of claim 8, wherein the determining the optimized bulk node voltage comprises:
   receiving an adjustment voltage level from a voltage regulator on the chip;
   determining an estimated gate delay based on the adjustment voltage level; and
   determining a critical path delay based on the estimated gate delay.

16. The method of claim 15, wherein the bulk node voltage is adjusted if the critical path delay exceeds a maximum delay associated with the chip.

17. The method of claim 8, further comprising updating at least one of the critical path data and the parametric data stored in the memory.

18. A method for adaptive body bias control, the method comprising:
   modeling parametric data associated with a chip design;
   modeling critical path data associated with the chip design;
   providing a chip according to the chip design;
   storing the parametric data and the critical path data in a memory on the chip;
   reading data from a parametric sensor on the chip;
   based on the data from the parametric sensor and the stored critical path and parametric data, determining an optimized bulk node voltage for reducing power consumption of the chip without causing a timing failure; and
   adjusting the bulk node voltage according to the optimized bulk node voltage, wherein the modeling the parametric data comprises simulating, for each gate type in the chip design, the saturation current and bulk node voltage as a function of voltage and temperature conditions.

19. The method of claim 18, wherein the critical path data comprises data from a static timing analysis of the chip.

20. A computer program embodied in a non-transitory computer-readable medium and executable by a processor, the computer program comprising logic configured to:
   receive monitored data associated with transistors on a chip from a parametric process monitor;
   receive a proposed voltage adjustment to a bulk node voltage corresponding to the chip;
   based on the proposed adjustment and parametric data stored in a memory device, determine an estimated gate delay, wherein the parametric data comprises a simulation of a gate delay of each gate type on the chip at a plurality of voltage and temperature conditions and saturation currents;
   estimate a critical path delay, based on the gate delay; and
   if the estimated critical path delay does not exceed a maximum delay corresponding to critical path data stored in the memory device, instruct a voltage regulator to adjust a bulk node voltage.

21. The computer program of claim 20, wherein the processor comprises a microcontroller.

* * * * *